Feb. 6, 1962

B. A. SCHWARZ 3,020,405

RADIO SENSITIVITY CONTROL

Original Filed Dec. 8, 1954

INVENTOR

Bertram A. Schwarz

BY R. E. Fowler

ATTORNEY

United States Patent Office 3,020,405
Patented Feb. 6, 1962

3,020,405

RADIO SENSITIVITY CONTROL

Bertram A. Schwarz, Kokomo, Ind., assignor to General Motors Corporation, Detroit, Mich., a corporation of Delaware Original application Dec. 8, 1954, Ser. No. 473,853. Divided and this application Oct. 23, 1959, Ser. No. 853,436
3 Claims. (Cl. 250—20)

Figure 1:
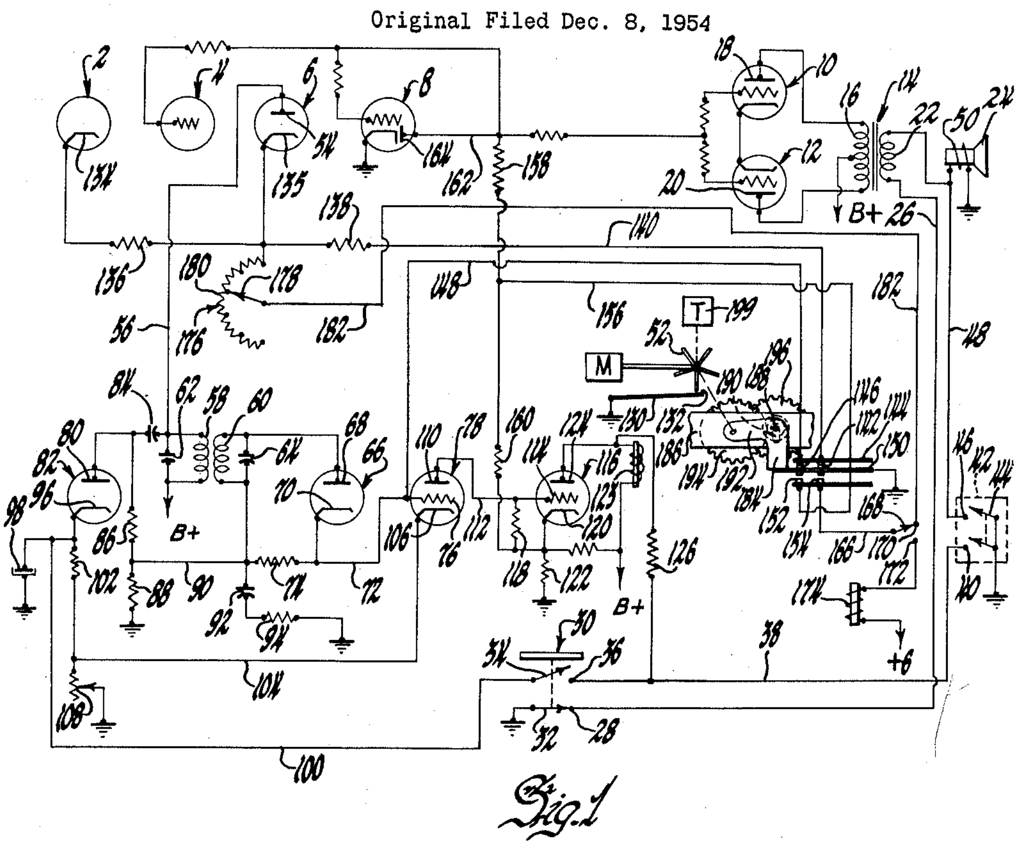

This invention relates to radio tuning means, and more particularly to means for changing the sensitivity of a radio receiver to a different value when it is being tuned from that when it is in tune or in listening position and is a division of United States Patent application Serial No. 473,853, filed December 8, 1954, now abandoned. There is currently on the market radio receiving apparatus which is automatically tuned by the receipt of an incoming signal. In this apparatus some motive means are provided for moving the tuning means over the band for which it is designed and upon receipt of an incoming signal in the amplifier, indexing or locking the tuning means accurately at that point to receive the incoming signal.

In order to provide differing degrees of stopping signals, some means is provided to change the sensitivity of the amplifier during the tuning portion of the cycle. For example, it may be desirable to have the amplifier more sensitive during the tuning period than during the listening period. Also, it may be desirable to be able to adjust the sensitivity during the tuning cycle. In this latter instance the receiver may be too sensitive where a large number of incoming signals are available and would stop on signals which are of insufficient signal to noise ratio to give satisfactory reception. At such times it would be desirable to make the amplifier more insensitive so that only stronger or local stations would cause the tuner to stop. At other times it may be desirable, for example at night in areas of good reception, to increase the sensitivity so that the receiver would tune in a larger number of weaker stations whose signals would be acceptable.

It is an object in making this invention to provide means for changing the sensitivity of a radio receiver between listening and tuning cycles.

It is a further object in making this invention to provide switching means for changing the sensitivity of a radio receiver between listening and automatic tuning periods.

It is a still further object in making this invention to provide switching means for changing receiver sensitivity, mechanically actuated by normal operation of the tuning means.

Figure 2:
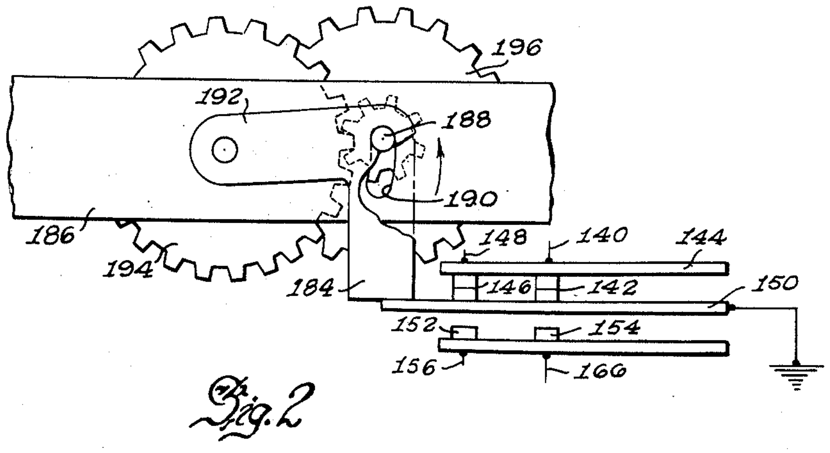

With these and other objects in view which will become apparent as the specification proceeds, my invention will be best understood by reference to the following specification and claims and the illustrations in the drawing in which:

FIGURE 1 is a partial circuit diagram of a signal tuned radio receiving set embodying my invention; and FIGURE 2 is an enlarged detail drawing of the gear train and switching means shown in FIG. 1.

Referring now more particularly to the partial circuit diagram shown in FIGURE 1, there is illustrated therein a radio frequency amplifier tube 2, an oscillator modulator tube 4, an intermediate frequency amplifier tube 6, a first audio amplifier 8, and two audio amplifier tubes 10 and 12 connected in push-pull relation to the audio output transformer 14, the primary 16 of which is connected across the plates 18 and 20 of the tubes 10 and 12 respectively, the secondary 22 being connected to the loud speaker 24. A conductor 26 connected to one side of the secondary winding 22 extends to a stationary contact 28 of a station selector switch indicated generally at 30. This switch consists of two movable armatures; the first indicated at 32 is adapted to engage the stationary contact 28 just referred to and is grounded and normally closed when the switch 30 is in its position of rest. The second movable armature 34, mechanically connected to the first but electrically insulated therefrom, is normally open as far as its switching action is concerned, inasmuch as it is out of engagement with its associated stationary contact 36 when it is in its inoperative position of rest. The stationary contact 36 of the second switch portion is connected through conductor 38 with a stationary contact 40 of a foot switch 42. The movable contacts 44 of sadi foot switch are connected directly to ground and adapted to engage stationary contact 40 and a second spaced stationary contact 46. This latter contact is connected through conductor 48 with one terminal of the loud speaker voice coil 50 and one side of the transformer winding 22. The B power supply is connected to the center tap of the primary 16 as indicated by B+.

The radio receiver is tuned by any conventional impedance varying means indicated as the small block labeled T which is diagrammatically shown as connected to a rotating indexing paddle wheel 52 driven by a motor M. When the motor or motive means is capable of turning the shaft upon which paddle wheel 52 is mounted, the radio receiver is tuned through the band. In order to stop the tuning means upon receipt of an incoming signal, a trigger circuit is provided upon which a signal voltage is developed when a transmitted wave is received in the receiver. When this occurs, the intermediate frequency amplifier 6 has developed upon its plate 54 a certain signal which is applied through a conductor 56 to an intermediate frequency transformer consisting of a primary 58 and a secondary 60, as is conventional. The primary 58 is tuned to the proper intermediate frequency by a condenser 62 and the secondary 60 in like manner tuned to the same frequency by condenser 64. A diode rectifier 66 has its plate 68 connected to one side of the secondary winding 60 and its cathode 70 connected to a conductor 72 which extends between one terminal of a resistor 74 and the control grid 76 of a triode tube 78.

The anode 80 of a second diode rectifier tube 82 is connected through a coupling condenser 84 to the primary 58 of the IF transformer. The diode rectifier 82 may be defined as the blocking diode as the signal developed by it is applied in opposing phase to that developed by the detector diode 66. Two resistors 86 and 88 are connected in series between the anode 80 and ground. A conductor 90 is connected to a point between resistors 86 and 88 and to one terminal of the resistance 74 and also to one terminal of the secondary 60 of the IF transformer. A condenser 92 is connected in series with a resistance 94 between conductor 90 and ground. The cathode 96 of rectifier tube 82 is connected to ground through condenser 98, through conductor 100 to movable switch arm 34 of switch 30, and through resistor 102 and conductor 104 to cathode 106 of the triode 78. A variable resistor 108 is connected between conductor 104 and ground.

In general, the function of the two diodes 82 and 66 is to provide a stopping signal at an accurate point in movement of the tuning mechanism so that it will stop at resonance of the incoming signal. The composite signal produced by these two diodes in opposition is developed from the resultant voltage appearing across resistor 88 and that across resistor 74 which are of opposed polarity, the latter being the positive voltage which it is desired to obtain on the grid 76 of the tube 78 in order to index the set. The plate 110 of the triode 78 is connected through conductor 112 directly to the control grid 114 of a second triode tube 116. A resistor 118 is connected between the control grid 114 and the cathode 120 of tube 116. A biasing resistor 122 is connected between the cathode 120 and ground. The high voltage B+ line is connected directly to one terminal of a relay coil 123, the opposite terminal of which is connected directly to plate 124 of the triode 116. Plate 124 is likewise connected to conductor 38 through a resistor 126. The relay coil 123 in this instance is capable of attracting the armature 130 which is so pivoted as to have its free end 132 drop into engagement with the paddle wheel 52 and normally prevent its turning. When the relay coil 123 is energized, however, it lifts the armature 130 out of the way and the paddle wheel may then rotate.

The type of drive illustrated in this instance is that of a loaded resilient member such as a spring so that when the paddle wheel is released the spring causes it to turn and rotate the shaft upon which it is mounted to drive the tuning means. In order that the tuning device will not move too fast, a gear train is provided such as that shown in the U.S. patent to Gierwiatowski, No. 2,494,235. The purpose of the gear train is to load the spring and act as a governor for the tuning apparatus.

It is desired to apply some switching means to the equipment so that the sensitivity of the receiver will be changed between listening and tuning positions. The sensitivity of the receiver is determined by the amount of resistance in the cathode circuits of the amplifier. These are diagrammatically shown as being the cathode 134 of the RF tube 2 which is connected directly to one end of a resistor 136 and cathode 135 of tube 6. A second resistor 138 is connected in series with resistor 136 and through conductor 140 to stationary contact 142 of a multiposition, multicontact switch 144. A second stationary contact 146 of that switch and supported in the same plane but insulated therefrom is connected through conductor 148 to the control grid 76 of the trigger operating tube 78. An oscillating armature 150 of the switch 144 is connected to ground and engages both stationary contacts 146 and 142 for completing a grounding circuit for each of them.

Armature 150 is mechanically actuated and is capable of moving away from the first two named contacts and into engagement with two other spaced insulated stationary contacts 152 and 154. Contact 152 is connected through conductor 156 to a point intermediate two series connected resistors 158 and 160. The opposite terminal of resistor 158 is connected through conductor 162 to the anode 164 of the audio amplifier tube 8. The opposite terminal of resistor 160 is connected to the cathode 120 of tube 116. The stationary contact 154 is connected through conductor 166 with a movable switch arm 168 which is adapted to engage either one of two stationary contacts 170 or 172. This switch arm 168 is of the snapover variety and remains in the stationary position to which it has last been moved. The movement of this arm is caused by movement of the tuner to its extreme limits.

As before mentioned, the tuner is driven in the tuning direction by dissipation of resilient energy from a spring motor M, but, when it reaches its extreme position, it mechanically moves the arm 168 down to its lower position engaging stationary contact 172 to complete a grounding circuit through operating solenoid coil 174, the opposite terminal of which is connected to the normal six volt supply as indicated by the arrow and +6. Since the solenoid is connected to the tuning means, the latter is quickly pulled to the opposite extreme position, loading the spring and resetting the switch 168. Since resistors 136 and 138 in the cathode strings of the amplifier determine the sensitivity of the receiver when the armature 150 is in its upper position, the resistor 136 in combination with a predetermined portion of the potentiometer 176 determines the sensitivity thereof when the armature 150 is in its lower position or when the device is tuning. The potentiometer 176 consists of a variable tap or arm 178 which moves over a series of tapped resistances 180, one end of which is connected intermediate the two resistances 136 and 138. The adjustable arm 178 is connected through conductor 182 to stationary contact 170 of the limit switch.

The means for actuating armature 150 from one position when the device is in listening position to another during the tuning position is provided by a bellcrank lever 184 mounted on a side arm 186 supporting the loading gear train. The lower end of the bellcrank 184 is adapted to engage the movable member 150. The center of the bellcrank carries a shaft 188 upon which is mounted one section of the loading gear train. The side member 186 supporting the gear train is provided with a slot 190 through which the shaft 188 projects into an opening in the bellcrank 184. The other leg 192 of the bellcrank is pivotally mounted on the side member 186. It is well known that when any gear train is loaded that peripheral forces are applied between gears and, therefore, when gears 194 and 196 are included in a driving train, the gear 196 will tend to rotate around the shaft upon which gear 194 is mounted, since it engages with a pinion on the shaft. Thus, the bellcrank lever 192 will be caused to move in a clockwise direction as shown when the gear train rotates.

In the operation of this system, assuming that the receiver is supplied with power and has warmed up sufficiently to be operative, the tuner will be in a given position which may be still tuned in to a signal to which it was responsive at the time the set was switched off. At this time the sensitivity of the receiver for listening purposes is determined by the resistances 136 and 138 in the cathode string of the amplifier section, since these are connected to ground through line 140, contact 142, armature 150, to ground. The sound waves are amplified in a conventional manner and applied to the loud speaker 24. Assuming now that the operator wishes to tune in another station, he therefore depresses switch 30 which closes movable switch arm 34 upon stationary contact 36 to complete an energizing circuit for the control relay 123. This circuit is from B+ through relay winding 123, resistance 126, contact 36, arm 34, line 100, resistances 102 and 108, to ground. Upon a completion of this circuit and initial movement of the tuner, tube 116 becomes conductive and switch 30 may be released, the energizing circuit for coil 123 being now completed through the tube 116 to maintain it energized. Relay coil 123, being energized, attracts its armature 130, moving the depending end 132 away from the periphery of the fan governor 52 which permits the same to be driven by the motor M, such for example as a spring motor. As governor 52 begins to rotate, the gear train, including gears 196 and 194, will be driven and due to the action previously mentioned, will cause a clockwise rotation of the shaft 188 and bellcrank 184 to move the switch arm 150 downwardly as shown in the drawing. This breaks engagement with contact 142 but completes a circuit with contact 154. Resistor 138 is now eliminated from the cathode string but there is included in its place some defined portion of the resistance 180 depending upon the setting of the movable arm 178. Thus, the sensitivity of the amplifier is changed between listening and tuning positions.

At the same time a ground upon control grid 76 is removed by armature 150 moving away from contact 146 which permits the trigger section to be energized and ready to stop the tuner upon receipt of an incoming signal. When such a signal is received, a positive pulse is applied to line 72 which results from the action of the double diodes in a manner completely described in Patent No. 2,652,486, James H. Guyton, granted September 15, 1953. This positive pulse drives tube 78 conductive upon the receipt of an incoming wave which in turn reduces the voltage on control grid 114 of tube 116 driving that tube to cutoff and deenergizing coil 123 which now again drops its armature 130 back into engagement with the paddle wheel 52 to index the receiver on that station.

When this occurs, of course, the load will be removed from the gear train and armature 150 is so designed so as to have sufficient resiliency to move back up against the bellcrank 184, away from the lower set of contacts as shown in the drawings and into engagement with the upper set, thus returning the receiver to listening sensitivity and at the same time reapplying a ground to the control grid 76 of the trigger tube.

If no station is encountered prior to the time that the tuner reaches its limit of travel under motor drive, the limit switch 168 is mechanically operated by the last short distance of tuner movement and moves the arm 168 from contact 170 over into engagement with contact 172. Since the armature 150 during tuning is in its lower position, an obvious circuit is completed through solenoid 174. This solenoid is adapted to quickly return the movable tuning means to its opposite extremity and to reload the normal spring drive. When it reaches the opposite extremity, a mechanical detent moves the switch arm 168 back into engagement with contact 170 and the circuit is now in its original condition. It is also to be noted that in moving away from contact 170, the receiver is made sensitive to any signals because the cathode string is broken to ground and, therefore, no stopping pulse can be applied. The actuation of switch 30 to initiate tuning to another station also causes switch arm 32 to move and open its engagement with stationary contact 28. This breaks the circuit for the audio transformer and, therefore, no sound is applied to the loud speaker. It is, therefore, muted during actuation of switch 30. Switch 42 is merely a remote switch which might be a foot operated one for inaugurating signal seeking tuning from some other point as desired. It is thus seen that by the simpler application of utilizing rotative forces in the gear train I have provided movable means for operating switching means to change the sensitivity in a radio receiver.

I claim:

1. In radio apparatus, means for tuning said apparatus over a predetermined band of frequencies, power storage means connected to the tuning means to drive the same over the band, a gear train load connected to the power storage means and tuning means to be driven thereby and to govern the movement of the tuning means, said gear train including rotatable shafts, means for mounting one of the rotatable shafts in the gear train for a slight amount of motion as a whole about the axis of a parallel shaft in the gear train, signal amplifying means in the apparatus, a plurality of circuits containing differing amounts of resistance connected to the amplifying means to provide different sensitivities therefor, switching means connected to said circuits for inclusion in the amplifying system and means actuated by the bodily movement of the shaft of the gear train engageable with said switching means to actuate the same when the gear train is driven to change the sensitivity of the amplifying means.

2. In radio apparatus, means for tuning the apparatus over a predetermined band of frequencies, power storage means connected to said tuning means to drive the same, a gear train load connected to the tuning means and driven by the same to govern the movement of the tuning means, said gear train including a rotatable shaft and parts having limited orbital motion about an axis parallel to said shaft between driving and indexed conditions, amplifying means in said apparatus, a plurality of circuits containing resistance connected to said amplifying means to provide different sensitivities therefor, and switching means connected to the circuits and actuated by relative orbital movement of parts of the gear train to vary the sensitivity of the amplifying means.

3. In radio apparatus, means for tuning said apparatus over a predetermined band of frequencies, power storage means connected to the tuning means to drive the same over the band, a gear train load connected to said power storage means and tuning means to be driven thereby and to govern the movement of the tuning means, said gear train load including a plurality of gear and pinion assemblies meshing together to change the speed ratio through the train, means for mounting at least one gear and pinion assembly for a moderate amount of orbital movement about its adjacent gear and pinion assemblies with which it meshes, signal amplifying means in the apparatus, a plurality of circuits containing differing amounts of resistance connected to the amplifying means to provide different sensitivities therefor, switching means connected to said circuits for inclusion in the amplifying system and means actuated by the orbital movement of said one gear and pinion assembly of the gear train engageable with said switching means to actuate the same when the gear train is driven to change the sensitivity of the amplifying means.

References Cited in the file of this patent

UNITED STATES PATENTS

| | | |
|---|---|---|
| 1,955,676 | Herchert | Apr. 17, 1934 |
| 1,999,359 | Hopkins | Apr. 30, 1935 |
| 2,494,235 | Gierwiatowski | Jan. 10, 1950 |
| 2,512,714 | Carlzen | June 27, 1950 |
| 2,614,213 | Lynan | Oct. 14, 1952 |
| 2,622,202 | Gierwiatowski | Dec. 16, 1952 |
| 2,652,494 | Guyton | Sept. 15, 1953 |
| 2,653,225 | Guyton | Sept. 22, 1953 |